(12) United States Patent
Sun et al.

(10) Patent No.: US 6,991,994 B2
(45) Date of Patent: Jan. 31, 2006

(54) METHOD OF FORMING ROUNDED CORNER IN TRENCH

(75) Inventors: Pei-Feng Sun, Hsinchu (TW); Yi Fu Chung, Hsinchu (TW); Jen Chieh Chang, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 141 days.

(21) Appl. No.: 10/771,688

(22) Filed: Feb. 3, 2004

(65) Prior Publication Data

US 2004/0253831 A1 Dec. 16, 2004

(30) Foreign Application Priority Data

Jun. 10, 2003 (CN) ............................... 92115751 A

(51) Int. Cl.
*H01L 21/76* (2006.01)
(52) U.S. Cl. ...................... 438/445; 438/435; 438/437; 438/444
(58) Field of Classification Search ............... 438/435, 438/437, 444, 445
See application file for complete search history.

(56) References Cited

U.S. PATENT DOCUMENTS

| | | | | |
|---|---|---|---|---|
| 6,096,612 A | * | 8/2000 | Houston ...................... | 438/296 |
| 6,524,929 B1 | * | 2/2003 | Xiang et al. ................. | 438/424 |
| 6,727,161 B2 | * | 4/2004 | Ahn et al. ................... | 438/444 |
| 6,828,213 B2 | * | 12/2004 | Mehrad et al. ............. | 438/435 |

* cited by examiner

*Primary Examiner*—Christian D. Wilson
(74) *Attorney, Agent, or Firm*—Townsend and Townsend and Crew LLP

(57) ABSTRACT

A method for forming a trench having rounded corners in a semiconductor device comprises providing a substrate; forming a first pad oxide layer, a first silicon nitride layer, and a first oxide layer on the substrate sequentially; removing portions of the first oxide layer, the first silicon nitride layer, the first pad oxide layer, and the substrate to form at least one trench; and removing portions of the first oxide layer, the first silicon nitride layer, and the first pad oxide layer in the trench above an upper corner of the substrate in the trench. The substrate includes a lower corner at a bottom of the trench. The method further comprises forming a second pad oxide layer in the trench; forming a second silicon nitride layer on the second pad oxide layer and the first oxide layer; removing portions of the second silicon nitride layer to expose the second pad oxide layer on the corners and the bottom of the trench; forming a thermal oxide layer on the second pad oxide layer exposed by removing the portions of the second nitride layer; and removing the second silicon nitride layer, the thermal oxide layer, and the second pad oxide layer.

20 Claims, 7 Drawing Sheets

METHOD OF FORMING ROUNDED CORNER IN TRENCH

CROSS-REFERENCES TO RELATED APPLICATIONS

This application claims priority from R.O.C. Patent Application No. 092115751, filed Jun. 10, 2003, the entire disclosure of which is incorporated herein by reference.

BACKGROUND OF THE INVENTION

The present invention relates to a method for forming rounded corners in the trench, and more particularly to a method of forming rounded corners in the trench of trench-type Metal-Oxide Semiconductor (trench-type MOS) devices or other integrated circuit elements.

Nowadays, trench-type MOS devices are widely used in the semiconductor industry. FIGS. 1(a) and 1(b) are diagrams illustrating part of a conventional fabrication method of the trench-type MOS devices. As shown in FIG. 1(a), in the manufacturing process of trench-type Metal-Oxide Semiconductor Field Effect Transistor (MOSFET), a semiconductor substrate 10 is firstly provided, and a pad oxide layer 11, a silicon nitride layer 12 and an oxide layer 13 are formed sequentially on the semiconductor substrate 10. Then, the oxide layer 13, the silicon nitride layer 12, the pad oxide layer 11 and the semiconductor substrate 10 are removed partially to form at least one trench 14 on the semiconductor substrate 10 with a conventional process, for example, the photolithography or etching process.

Because of the plasma etching process used for forming the trench 14, some lattice defects or non-planar surfaces are usually formed simultaneously on the sidewalls of the trench 14. As a result, in order to solve this problem, a sacrifice oxide layer (not shown) is first formed on the trench 14 and then removed later.

Then, as shown in FIG. 1(b), an oxide layer is formed on the oxide layer 13 and in the trench 14 to be a gate oxide layer or dielectric layer 15. After that, some processes, such as the formation of a bottom oxide layer (not shown) at the bottom of the trench 14 and/or the deposition of a polysilicon layer into the trench 14, will be further performed to complete the manufacturing process of the trench-type Metal-Oxide Semiconductor Field Effect Transistor (MOSFET).

As seen in FIG. 1(a), after the trench 14 is formed by the plasma etching process, the sidewalls of the trench 14 usually have a vertical profile, and the bottom corner of the trench forms nearly a right angle. Therefore, during the subsequent oxidation processes, a gate oxide layer or a dielectric layer 15 would be formed along the entire profile of the trench 14. After the subsequent oxidation processes, a polysilicon layer may be deposited in the trench 14 which is formed by first removing the oxide layer 13, the silicon nitride layer 12, and the pad oxide layer, with the top corners and the bottom corners of the trench 14 each nearly at a right angle. As a result, the lattices of the polysilicon near the top corners of the trench 14 would squeeze each other to apply corner stresses on the top corners of the trench 14. Moreover, the gate oxide layer or the dielectric layer 15 near the bottom corners of the trench 14 also would be formed with non-uniform thickness.

FIGS. 2(a) and 2(b) are scanning electron microscope (SEM) pictures of the top corners and bottom corners of the trench through the steps of the conventional manufacturing process. As illustrated in FIG. 2(a), the top corners of the trench 14 each have the profile of substantially a right angle. Thus, the lattices near the top corners of the trench 14 would squeeze each other. It leads to corner stresses in the trench 14. Therefore, point discharge would occur when a trench type MOSFET is operated. In addition, as shown in FIG. 2(b), the bottom corners of the trench 14 are not rounded, but are each at substantially a right angle. The thickness of the gate oxide layer or the dielectric layer 15 will be non-uniform when the gate oxide layer or the dielectric layer 15 is formed in the trench 14. This could cause serious current leakage when the trench type MOSFET is operated.

BRIEF SUMMARY OF THE INVENTION

Embodiments of the present invention provide a method for forming rounded corners in the trench, which is used for manufacturing trench-type Metal-Oxide Semiconductor (MOS) devices or integrated circuit elements to prevent or reduce corner stress and non-uniform thickness of gate oxide layer or dielectric oxide layer and further to prevent or reduce the occurrence of point discharge and current leakage of semiconductor devices.

In accordance with an aspect of the present invention, a method for forming a trench having rounded corners in a semiconductor device comprises providing a semiconductor substrate; forming a first pad oxide layer, a first silicon nitride layer, and a first oxide layer on the semiconductor substrate sequentially; removing portions of the first oxide layer, the first silicon nitride layer, the first pad oxide layer, and the semiconductor substrate to form at least one trench; and removing portions of the first oxide layer, the first silicon nitride layer, and the first pad oxide layer in the trench above an upper corner of the semiconductor substrate in the trench. The semiconductor substrate includes a lower corner at a bottom of the trench. The method further comprises forming a second pad oxide layer in the trench; forming a second silicon nitride layer on the second pad oxide layer and the first oxide layer; removing portions of the second silicon nitride layer to expose the second pad oxide layer on the corners and the bottom of the trench; forming a thermal oxide layer on the second pad oxide layer exposed by removing the portions of the second nitride layer; and removing the second silicon nitride layer, the thermal oxide layer, and the second pad oxide layer.

In some embodiments, removing portions of the first oxide layer, the first silicon nitride layer, the first oxide layer, and the semiconductor substrate is performed by a photolithography process or an etching process. At least one trench has a depth of between about 1 μm and about 3 μm and a width of about 0.2 μm and about 1 μm. Removing portions of the first oxide layer, the first silicon nitride layer, and the first pad oxide layer in the trench is performed using HF. The second silicon nitride layer is formed by deposition. Removing portions of the second silicon nitride layer to expose the second pad oxide layer is performed by dry etching. The thermal oxide layer is formed by thermal oxidation. Removing the second nitride layer, the thermal oxide layer, and the second pad oxide layer is performed with phosphoric acid. The method may further comprise forming a second oxide layer in the trench and on the first oxide layer after removing the second silicon nitride layer, the thermal oxide layer, and the second pad oxide layer. The second pad oxide layer is formed over surfaces of the semiconductor substrate in the trench. Removing portions of the first oxide layer, the first silicon nitride layer, and the first pad oxide layer in the trench exposes the upper corner of the semiconductor substrate in the trench. Removing the second silicon nitride layer, the thermal oxide layer, and the second pad oxide layer forms a rounded upper corner and a rounded lower corner of the semiconductor substrate in the trench for a trench-type metal oxide semiconductor device.

In accordance with another aspect of the invention, a method for forming a trench having rounded corners in a semiconductor device comprises providing a semiconductor substrate having thereon a first pad oxide layer, a first silicon nitride layer on the first pad oxide layer, and a first oxide layer on the first silicon nitride layer, and at least one trench extending through the first oxide layer, the first silicon nitride layer, and the first pad oxide layer, and partially through the semiconductor substrate. The trench is enlarged above the semiconductor substrate along sidewalls of the first oxide layer, the first silicon nitride layer, and the first pad oxide layer. The semiconductor substrate includes a lower corner at a bottom of the trench and an upper corner below the sidewalls of the first oxide layer, the first silicon nitride layer, and the first pad oxide layer. The method further comprises forming a second pad oxide layer in the trench; forming a second silicon nitride layer on the second pad oxide layer and the first oxide layer; removing portions of the second silicon nitride layer to expose the second pad oxide layer on the corners and the bottom of the trench; forming a thermal oxide layer on the second pad oxide layer exposed by removing the portions of the second nitride layer; and removing the second silicon nitride layer, the thermal oxide layer and the second pad oxide layer.

In accordance with another aspect of the present invention, a method for forming a trench having rounded corners in a semiconductor device comprises providing a semiconductor substrate having thereon a first pad oxide layer, a first silicon nitride layer on the first pad oxide layer, and a first oxide layer on the first silicon nitride layer, and at least one trench extending through the first oxide layer, the first silicon nitride layer, and the first pad oxide layer, and partially through the semiconductor substrate. The trench is enlarged above the semiconductor substrate along sidewalls of the first oxide layer, the first silicon nitride layer, and the first pad oxide layer. The semiconductor substrate includes a lower corner at a bottom of the trench and an upper corner below the sidewalls of the first oxide layer, the first silicon nitride layer, and the first pad oxide layer. A second pad oxide layer is formed in the trench and a second silicon nitride layer is formed on the second pad oxide layer and the first oxide layer. The method further comprises removing portions of the second silicon nitride layer to expose the second pad oxide layer on the corners and the bottom of the trench; forming a thermal oxide layer on the second pad oxide layer exposed by removing the portions of the second nitride layer; and removing the second silicon nitride layer, the thermal oxide layer and the second pad oxide layer.

DETAILED DESCRIPTION OF THE INVENTION

The method of the present embodiment is primarily applied to manufacture a trench-type Metal-Oxide Semiconductor (trench-type MOS) device or an integrated circuit element with rounded corners in the trench, to prevent or reduce corner stress and non-uniform thickness of gate oxide layer and dielectric oxide layer, further to prevent or reduce the occurrence of point discharge and current leakage, and to prevent or reduce the change of the electrical properties of the trench-type MOS or integrated circuit element. Although the present embodiment takes the fabrication of the trench-type Metal-Oxide Semiconductor Field Effect Transistor (MOSFET) as an example, other types of trench-type power MOS devices can utilize the method of the invention.

Figure 1A:
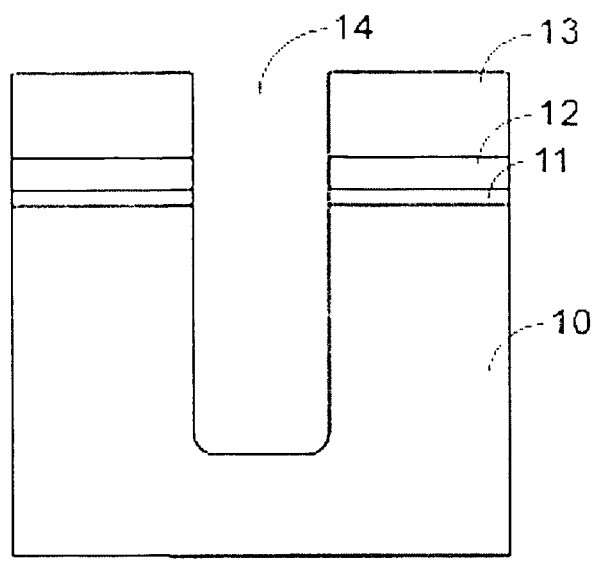
FIGS. 1(a) to 1(b) are diagrams illustrating part of a conventional fabrication method of the trench-type MOS devices.
Figure 1B:
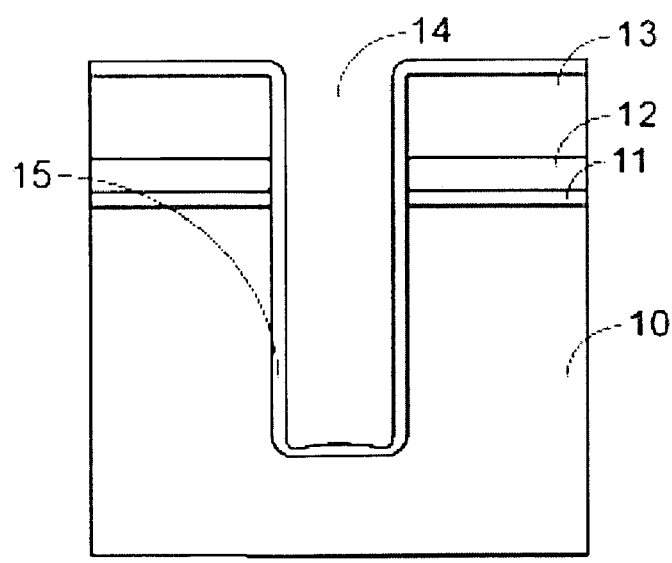
Figure 2A:
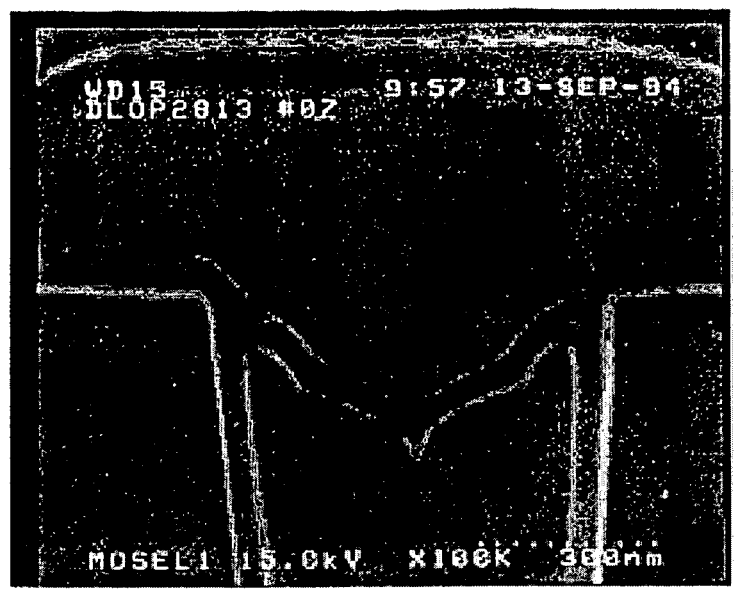
FIG. 2(a) is a scanning electron microscope (SEM) picture from the top of the trench through the conventional fabrication.
Figure 2B:
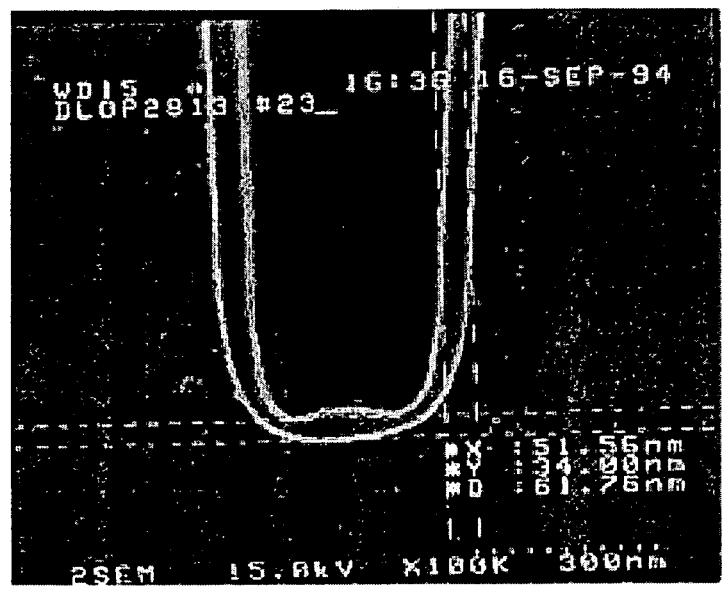
FIG. 2(b) is a scanning electron microscope (SEM) picture from the bottom of the trench through the conventional fabrication.
Figure 3A:
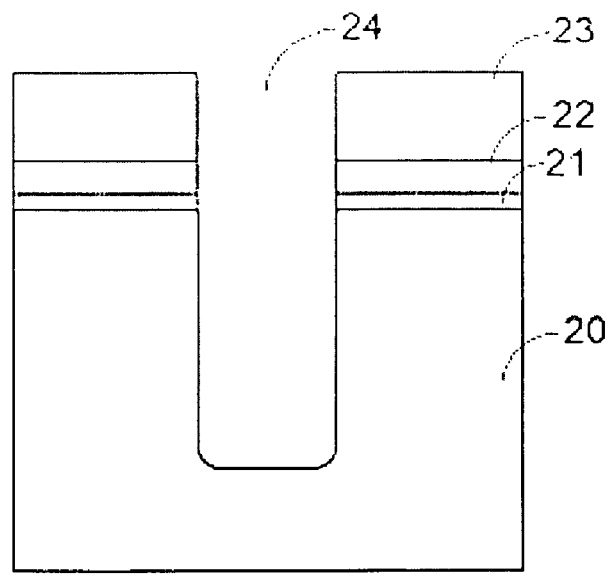
FIGS. 3(a) to 3(g) are diagrams illustrating process steps according to an embodiment of the present invention.

FIGS. 3(a) to 3(g) are the diagrams illustrating the exemplary embodiment of present the invention. As shown in FIG. 3(a), in the fabrication process of the trench-type Metal-Oxide Semiconductor Field Effect Transistor (MOSFET), a semiconductor substrate 20 is first provided, and the semiconductor substrate 20 is usually a silicon substrate. Then, a pad oxide layer 21, a silicon nitride layer 22 and an oxide layer 23 are formed sequentially on the semiconductor substrate 20, wherein the first pad oxide layer 21 serves as a buffer for lowering the stress between the semiconductor substrate 20 and the first silicon nitride layer 22, and the first oxide layer 23 is a silicon oxide layer. After that, the first oxide layer 23, the first silicon nitride layer 22, the first pad oxide layer 21 and the semiconductor substrate 20 are removed partially by the photolithography or etching process to form at least one trench 24. Preferably, the trench has a depth of between about 1.0 $\mu$m and 3.0 $\mu$m and a width of between about 0.2 $\mu$m and 1.0 $\mu$m.

Figure 3B:
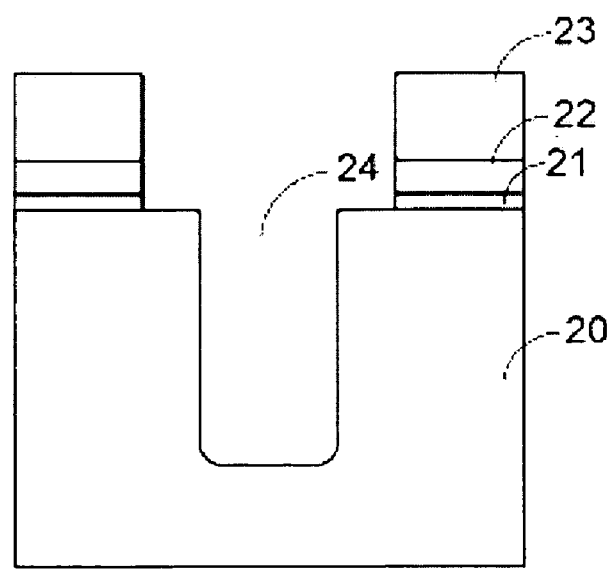
Figure 3C:
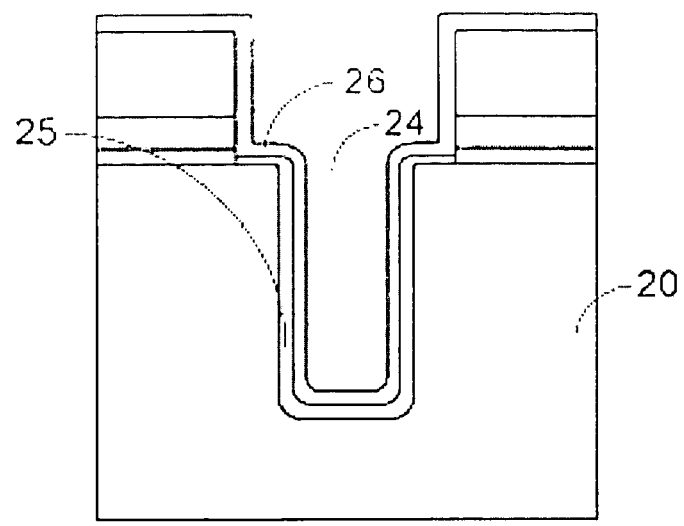

Then, as shown in FIG. 3(b), the first oxide layer 23, the first silicon nitride layer 22, and the first pad oxide layer 21 near the trench 24 are removed partially by a wet etching process with HF. After that, as shown in FIG. 3(c), a second pad oxide layer 25 is formed on the trench 24, and a second silicon nitride layer 26 is deposited on the second pad oxide layer 25 and covers the first oxide layer 23. Preferably, the second pad oxide layer 25 has a depth of between about 300 Å and 400 Å, and the second silicon nitride layer 26 has a depth of about 200 Å.

Figure 3D:
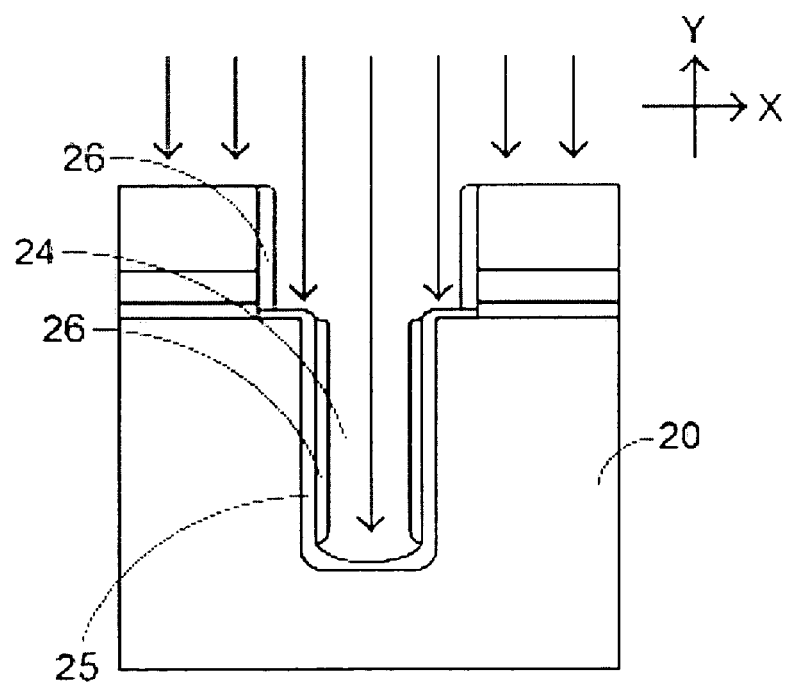
Figure 3E:
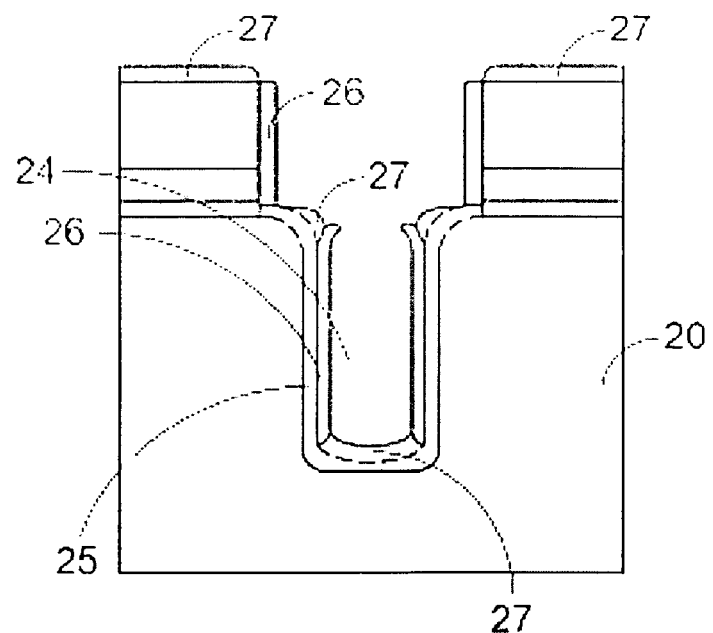
Figure 3F:
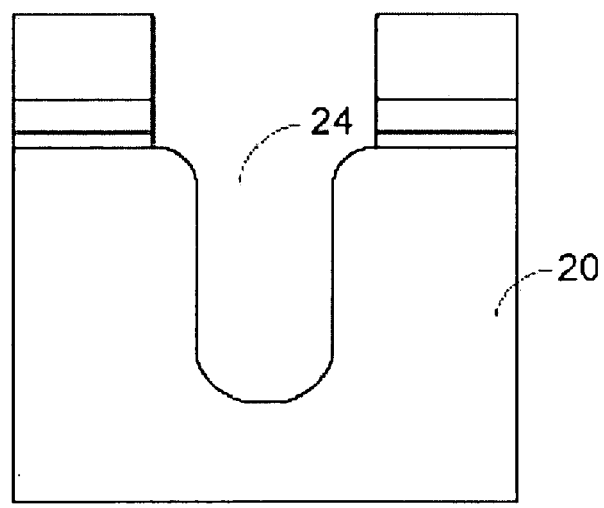
Figure 3G:
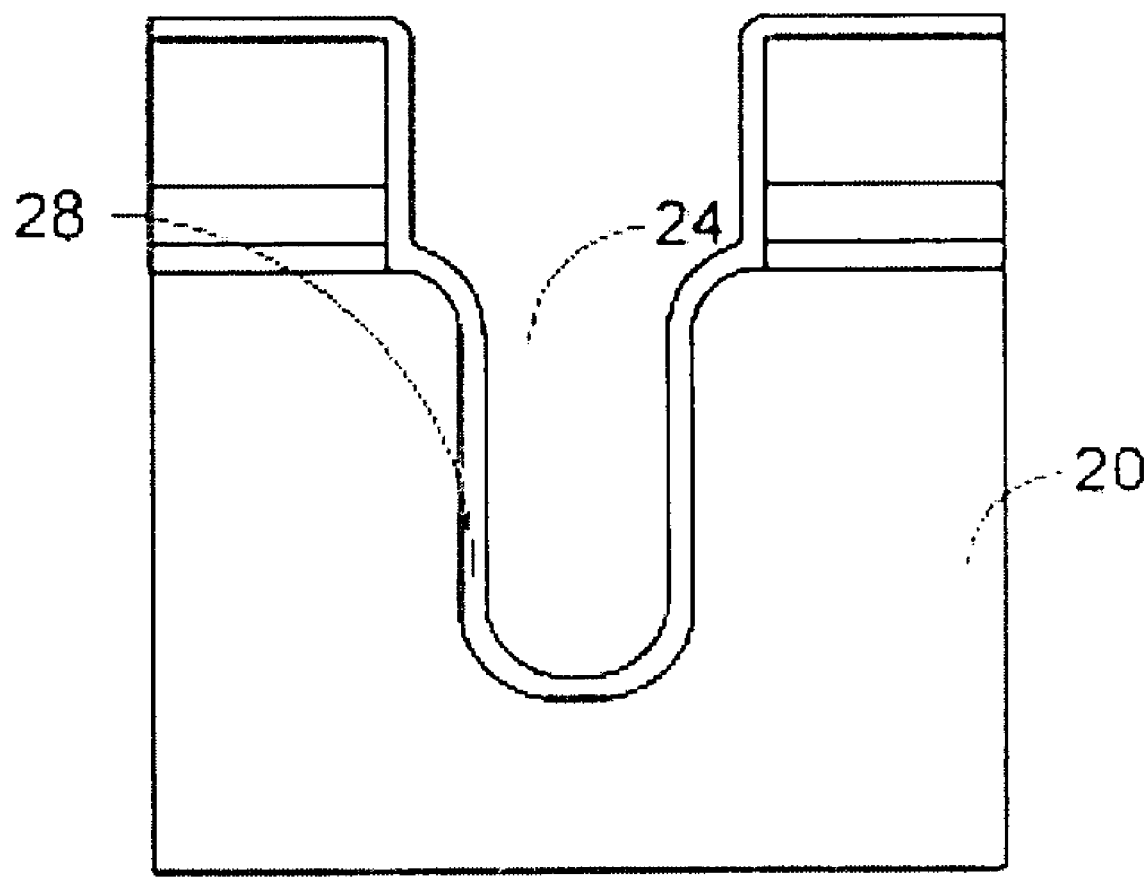

As shown in FIG. 3(d), the second silicon nitride layer 26 is removed in the horizontal direction (X direction) with a dry etching process. After that, the second silicon nitride layer 26 in vertical direction (Y direction) will remain, so as to expose the second pad oxide layer 25 on the top corners of the trench 24 and the bottom of the trench 24 and the first oxide layer 23. Next, as shown in FIG. 3(e), a thermal oxide layer 27 is formed by thermal oxidation process on the top corners and the bottom of the trench 24 exposed by etching the second silicon nitride layer 26 in the preceding step. At the same time, a thin thermal oxide layer 27 is also formed on the first oxide layer 23. After that, as shown in FIG. 3(f), the second silicon nitride layer 26, the thermal oxide layer 27, and the second pad oxide layer 25 are removed by HF to form the trench 24 with top rounded corners and bottom rounded corners. Finally, as shown in FIG. 3(g), a second oxide layer is formed on the trench 24 and the first oxide layer 23 to be a gate oxide layer or dielectric layer 28.

Then, the following steps may be performed to finish the manufacturing process. For example, a bottom gate oxide layer is formed on the bottom of the trench 24, polysilicon is deposited in the trench 24, and/or the first oxide layer 23, the first silicon nitride layer 22, and the first pad oxide layer 21 are removed to finish the fabrication of MOSFET.

Figure 4A:
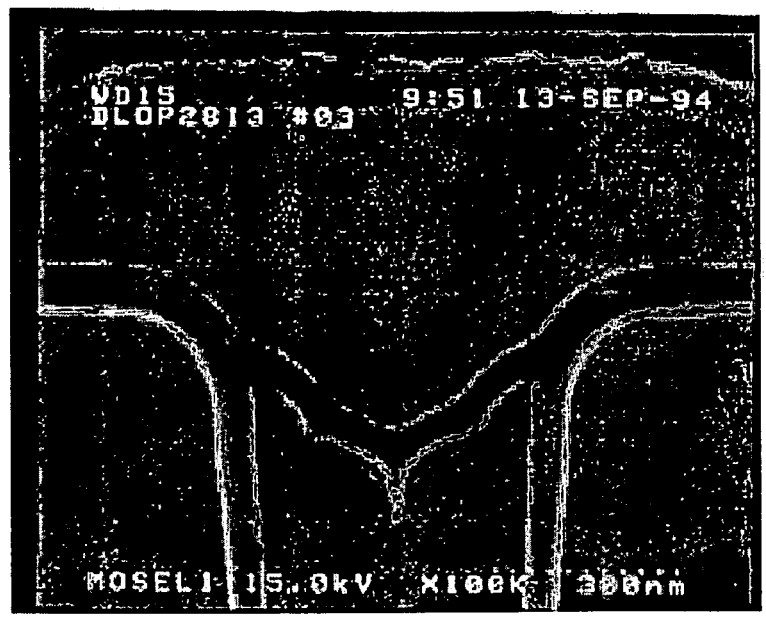
FIG. 4(a) is a scanning electron microscope (SEM) picture from the top of the trench through the fabrication of the present invention.
Figure 4B:
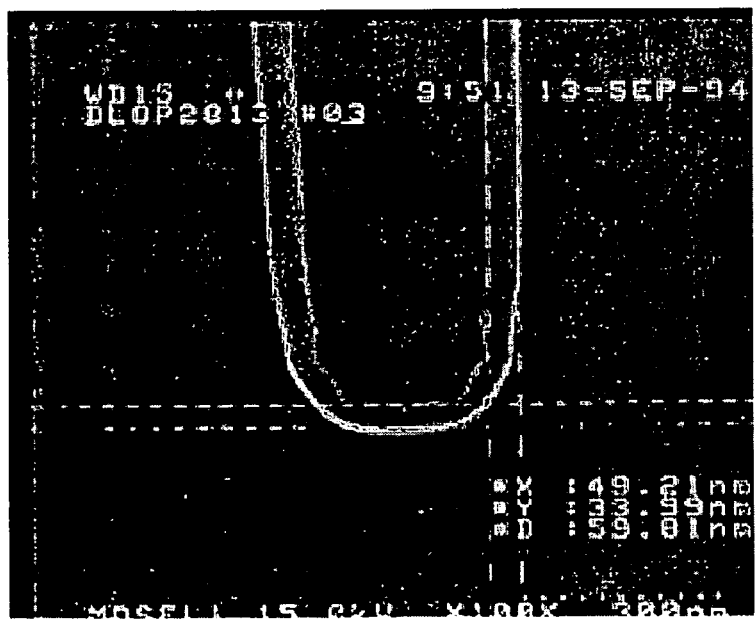
FIG. 4(b) is a scanning electron microscope (SEM) picture from the bottom of the trench through the fabrication of a semiconductor device according to an embodiment of the present invention.

FIGS. 4(a) and 4(b) are scanning electron microscope (SEM) pictures of the top and bottom corners, respectively, of the trench manufactured according to the present embodiment. As illustrated in FIG. 4(a), the top corners of the trench 24 each have a substantially rounded profile using the above-mentioned process. Therefore, the lattices near the top corners will not squeeze each other easily, and the corner stress will not form as readily in the trench as in the prior art. The point discharge will be avoided or reduced when the trench type MOSFET device is operated. Furthermore, as shown in FIG. 4(b), the bottom corners of the trench 24 each have a substantially rounded profile using the above method. As a result, the thickness of the gate oxide layer or dielectric layer 28 will be formed more uniformly, so that serious current leakage, will be prevented when trench-type MOS device is operated.

In sum, the present embodiment provides a method for forming rounded corners in the trench as applied to a trench-type Metal-Oxide Semiconductor (trench-type MOS) device or in the fabrication of other integrated circuits. Through the present method, not only the problems of the corner stress and the non-uniform thickness of the gate oxide layer, but also the occurrence of point discharge and current leakage, can be avoided or reduced.

The above-described arrangements of apparatus and methods are merely illustrative of applications of the principles of this invention and many other embodiments and modifications may be made without departing from the spirit and scope of the invention as defined in the claims. For example, the shapes and sizes of the components that form the camera supporting device may be changed. The scope of the invention should, therefore, be determined not with reference to the above description, but instead should be determined with reference to the appended claims along with their full scope of equivalents.

What is claimed is:

1. A method for forming a trench having rounded corners in a semiconductor device, the method comprising:
   providing a semiconductor substrate;
   forming a first pad oxide layer, a first silicon nitride layer, and a first oxide layer on the semiconductor substrate sequentially;
   removing portions of the first oxide layer, the first silicon nitride layer, the first pad oxide layer, and the semiconductor substrate to form at least one trench;
   removing portions of the first oxide layer, the first silicon nitride layer, and the first pad oxide layer in the trench above an upper corner of the semiconductor substrate in the trench, the semiconductor substrate including a lower corner at a bottom of the trench;
   forming a second pad oxide layer in the trench;
   forming a second silicon nitride layer on the second pad oxide layer and the first oxide layer;
   removing portions of the second silicon nitride layer to expose the second pad oxide layer on the corners and the bottom of the trench;
   forming a thermal oxide layer on the second pad oxide layer exposed by removing the portions of the second nitride layer; and
   removing the second silicon nitride layer, the thermal oxide layer, and the second pad oxide layer.

2. The method of claim 1 wherein removing portions of the first oxide layer, the first silicon nitride layer, the first oxide layer, and the semiconductor substrate is performed by a photolithography process or an etching process.

3. The method of claim 1 wherein the at least one trench has a depth of between about 1 μm and about 3 μm and a width of about 0.2 μm and about 1 μm.

4. The method of claim 1 wherein removing portions of the first oxide layer, the first silicon nitride layer, and the first pad oxide layer in the trench is performed using HF.

5. The method of claim 1 wherein the second silicon nitride layer is formed by deposition.

6. The method of claim 1 wherein removing portions of the second silicon nitride layer to expose the second pad oxide layer is performed by dry etching.

7. The method of claim 1 wherein the thermal oxide layer is formed by thermal oxidation.

8. The method of claim 1 wherein removing the second nitride layer, the thermal oxide layer, and the second pad oxide layer is performed with phosphoric acid.

9. The method of claim 1 further comprising forming a second oxide layer in the trench and on the first oxide layer after removing the second silicon nitride layer, the thermal oxide layer, and the second pad oxide layer.

10. The method of claim 1 wherein the second pad oxide layer is formed over surfaces of the semiconductor substrate in the trench.

11. The method of claim 1 wherein removing portions of the first oxide layer, the first silicon nitride layer, and the first pad oxide layer in the trench exposes the upper corner of the semiconductor substrate in the trench.

12. The method of claim 1 wherein removing the second silicon nitride layer, the thermal oxide layer, and the second pad oxide layer forms a rounded upper corner and a rounded lower corner of the semiconductor substrate in the trench for a trench-type metal oxide semiconductor device.

13. A method for forming a trench having rounded corners in a semiconductor device, the method comprising:
    providing a semiconductor substrate having thereon a first pad oxide layer, a first silicon nitride layer on the first pad oxide layer, and a first oxide layer on the first silicon nitride layer, and at least one trench extending through the first oxide layer, the first silicon nitride layer, and the first pad oxide layer, and partially through the semiconductor substrate; wherein the trench is enlarged above the semiconductor substrate along sidewalls of the first oxide layer, the first silicon nitride layer, and the first pad oxide layer; wherein the semiconductor substrate includes a lower corner at a bottom of the trench and an upper corner below the sidewalls of the first oxide layer, the first silicon nitride layer, and the first pad oxide layer;
    forming a second pad oxide layer in the trench;
    forming a second silicon nitride layer on the second pad oxide layer and the first oxide layer;
    removing portions of the second silicon nitride layer to expose the second pad oxide layer on the corners and the bottom of the trench;
    forming a thermal oxide layer on the second pad oxide layer exposed by removing the portions of the second nitride layer; and removing the second silicon nitride layer, the thermal oxide layer and the second pad oxide layer.

14. The method of claim 13 further comprising forming a second oxide layer in the trench and on the first oxide layer after removing the second silicon nitride layer, the thermal oxide layer, and the second pad oxide layer.

15. The method of claim 13 wherein the second pad oxide layer is formed over surfaces of the semiconductor substrate in the trench.

16. The method of claim 13 wherein removing portions of the first oxide layer, the first silicon nitride layer, and the first pad oxide layer in the trench exposes the upper corner of the semiconductor substrate in the trench.

17. The method of claim 13 wherein removing the second silicon nitride layer, the thermal oxide layer, and the second pad oxide layer forms a rounded upper corner and a rounded lower corner of the semiconductor substrate in the trench.

18. A method for forming a trench having rounded corners in a semiconductor device, the method comprising:

providing a semiconductor substrate having thereon a first pad oxide layer, a first silicon nitride layer on the first pad oxide layer, and a first oxide layer on the first silicon nitride layer, and at least one trench extending through the first oxide layer, the first silicon nitride layer, and the first pad oxide layer, and partially through the semiconductor substrate; wherein the trench is enlarged above the semiconductor substrate along sidewalls of the first oxide layer, the first silicon nitride layer, and the first pad oxide layer; wherein the semiconductor substrate includes a lower corner at a bottom of the trench and an upper corner below the sidewalls of the first oxide layer, the first silicon nitride layer, and the first pad oxide layer; wherein a second pad oxide layer is formed in the trench and a second silicon nitride layer is formed on the second pad oxide layer and the first oxide layer;

removing portions of the second silicon nitride layer to expose the second pad oxide layer on the corners and the bottom of the trench;

forming a thermal oxide layer on the second pad oxide layer exposed by removing the portions of the second nitride layer; and removing the second silicon nitride layer, the thermal oxide layer and the second pad oxide layer.

19. The method of claim 18 wherein removing portions of the first oxide layer, the first silicon nitride layer, and the first pad oxide layer in the trench exposes the upper corner of the semiconductor substrate in the trench; and wherein the second pad oxide layer is formed over surfaces of the semiconductor substrate in the trench.

20. The method of claim 18 wherein removing the second silicon nitride layer, the thermal oxide layer, and the second pad oxide layer forms a rounded upper corner and a rounded lower corner of the semiconductor substrate in the trench for a trench-type metal oxide semiconductor device.

* * * * *